United States Patent
Uchiyama et al.

(10) Patent No.: US 9,699,934 B2
(45) Date of Patent: Jul. 4, 2017

(54) ELECTRONIC APPARATUS AND CONNECTION DEVICE

(71) Applicants: Beijing Lenovo Software Ltd., Haidian District, Beijing (CN); Lenovo (Beijing) Co., Ltd., Beijing (CN)

(72) Inventors: Yoshiharu Uchiyama, Beijing (CN); Jun Xu, Beijing (CN)

(73) Assignees: BEIJING LENOVO SOFTWARE LTD., Haidian District, Beijing (CN); LENOVO (BEIJING) CO., LTD., Haidian District, Beijing (CN)

( * ) Notice: Subject to any disclaimer, the term of this patent is extended or adjusted under 35 U.S.C. 154(b) by 362 days.

(21) Appl. No.: 14/027,432

(22) Filed: Sep. 16, 2013

(65) Prior Publication Data

US 2014/0078654 A1    Mar. 20, 2014

(30) Foreign Application Priority Data

Sep. 17, 2012    (CN) .......................... 2012 1 0345868

(51) Int. Cl.
*E05D 11/10* (2006.01)
*H05K 7/16* (2006.01)
(Continued)

(52) U.S. Cl.
CPC ............. *H05K 7/16* (2013.01); *G06F 1/1681* (2013.01); *H04M 1/0216* (2013.01);
(Continued)

(58) Field of Classification Search
CPC ............. Y10T 16/5387; Y10T 16/5403; Y10T 16/54035; Y10T 16/540225; G06F 1/1681;
(Continued)

(56) References Cited

U.S. PATENT DOCUMENTS 6,070,298 A * 6/2000 Sorimachi ............. E05F 1/1215
16/303
6,175,990 B1 * 1/2001 Kato ..................... G06F 1/1616
16/303
(Continued)

FOREIGN PATENT DOCUMENTS

CN        201420800 Y     3/2010
CN        201786912 U     4/2011
(Continued)

OTHER PUBLICATIONS

Chinese First Office Action with English Translation for related Application No. 201210345868.6 dated Sep. 3, 2014, 15 pages.
(Continued)

*Primary Examiner* — Chuck Mah
(74) *Attorney, Agent, or Firm* — Brinks Gilson & Lione; G. Peter Nichols

(57) ABSTRACT

An electronic apparatus includes a first body; a second body; a connection device including: a connection body through which the first body is connected with the second body; with a first torque generator and a second torque generator provided inside the connection body. When an angle value is in a first preset threshold range, the first torque generator generates a first torque for balancing a second torque generated by gravitation of the first body. When the angle value is larger than a maximum value of the first preset threshold range, the first torque generator generates a third torque and the second torque generator generates a fourth torque; the third torque and the fourth torque balancing a fifth torque generated by a first composite force, which is the composite force of the gravitation of the first body and a push force acting on a touch control unit.

10 Claims, 3 Drawing Sheets

(51) Int. Cl.
*H05K 5/02* (2006.01)
*H04M 1/02* (2006.01)
*G06F 1/16* (2006.01)

(52) U.S. Cl.
CPC ......... *H05K 5/0226* (2013.01); *G06F 1/1616* (2013.01); *H04M 2250/22* (2013.01); *Y10T 16/5385* (2015.01)

(58) Field of Classification Search
CPC ... G06F 1/1616; G06F 1/1618; H05K 5/0226; H04M 1/0216; E05Y 2900/606; E05D 11/087; E05D 11/08; E05D 11/081; E05D 11/082; E05D 11/084; E05D 11/085
See application file for complete search history.

(56) References Cited

U.S. PATENT DOCUMENTS

| | | | | |
|---|---|---|---|---|
| 7,055,215 | B1* | 6/2006 | Ligtenberg | G06F 1/1616 16/289 |
| 7,055,217 | B2* | 6/2006 | Nishihara | G06F 1/1616 16/303 |
| 7,200,224 | B2* | 4/2007 | Park | H04M 1/022 379/428.01 |
| 2005/0091794 | A1* | 5/2005 | Kang | E05D 11/1078 16/284 |
| 2006/0005356 | A1* | 1/2006 | Amano | H04M 1/0216 16/341 |
| 2006/0064850 | A1* | 3/2006 | Sato | G06F 1/1616 16/330 |
| 2006/0279920 | A1* | 12/2006 | Lee | G06F 1/162 361/679.27 |
| 2007/0089271 | A1 | 4/2007 | Jo et al. | |
| 2007/0089272 | A1* | 4/2007 | Kuwajima | G06F 1/1616 16/303 |
| 2009/0056073 | A1* | 3/2009 | Lin | G06F 1/1681 16/235 |
| 2009/0217486 | A1* | 9/2009 | Itakura | G06F 1/1616 16/334 |
| 2011/0102982 | A1* | 5/2011 | Minaguchi | G06F 1/1681 361/679.01 |
| 2011/0119867 | A1* | 5/2011 | Chen | G06F 1/1681 16/342 |
| 2011/0265288 | A1* | 11/2011 | Chiang | G06F 1/1681 16/341 |
| 2012/0036679 | A1* | 2/2012 | Chen | E05D 11/084 16/284 |
| 2012/0194972 | A1* | 8/2012 | Bohn | G06F 1/1681 361/679.01 |
| 2012/0206893 | A1* | 8/2012 | Bohn | H04M 1/022 361/807 |
| 2013/0081229 | A1* | 4/2013 | Hirano | G06F 1/1616 16/341 |
| 2013/0160243 | A1* | 6/2013 | Kakizaki | H04M 1/0216 16/341 |

FOREIGN PATENT DOCUMENTS

| | | | | |
|---|---|---|---|---|
| KR | 20030092235 A | * | 12/2003 | ............ F16M 11/10 |
| TW | 201024964 A1 | | 7/2010 | |

OTHER PUBLICATIONS

Third Office Action dated Aug. 3, 2015 out of corresponding Chinese priority Application No. 201210345868.6 (8 pages).
Fourth Office Action dated Jan. 20, 2016 out of Chinese priority Application No. 201210345868.6 (16 pages including English translation).
Office Action, and English language translation thereof, in corresponding Chinese Application Serial No. 201210345868.6, dated Aug. 9, 2016, 4 pages.
Chinese Second Office Action with English Translation for related Application No. 201210345868.6 dated Jan. 15, 2015, 7 pages.

* cited by examiner

ELECTRONIC APPARATUS AND CONNECTION DEVICE

BACKGROUND

This application claims priority to Chinese patent application No. 201210345868.6 filed Sep. 17, 2012, the entire contents of which are incorporated herein by reference.

The present invention relates to the field of mechanical technique, and particularly relates to a connection device of an electronic apparatus.

With the development of electronic technology, more and more electronic apparatuses such as laptop computer, mobile phone, integrated machine or the like occur. As shown in FIG. 1, many electronic apparatuses include the following structure:

A first body 101, wherein, the first body 101 generally includes a display screen 102 such as touch control screen, glass screen or the like;

A second body 103, wherein, the second body 103 can be keyboard, host, touch control panel or the like;

A connection device 104, through which the first body 101 is connected with the second body 103, wherein, the angle value between the first body 101 and the second body can vary by rotating around the connection device 104.

The inventor of this application found at least the following technical problems in the prior art in the procedure of implementing the technical solution of the embodiment of this application:

(1) Since in the prior art, when there is a touch control operation on the touch control unit, the push force generated by the touch control operation causes the display screen to shake, it causes the positioning of the position corresponding to the touch control operation on the display screen not accurate enough, further, there is the technical problem of inconvenient operation;

(2) Since in the prior art, if the electronic apparatus is further provided with a torque generator for balancing the push force of the touch control operation, because there is torque rebound phenomenon when the electronic apparatus is closed, the technical problem of damaging the electronic apparatus occurs, for example, breaking off of screw, rupture of the casing of the electronic apparatus, and so on.

SUMMARY

The embodiment of the present invention provides an electronic apparatus and a connection device for solving the technical problem that the positioning of the touch control operation to the electronic apparatus is not accurate or damage to the electronic apparatus in the prior art.

On the one hand, one embodiment of this application provides the following technical solution:

An electronic apparatus, includes:

A first body, the first body including a touch control unit;

A second body;

A connection device including: a connection body through which the first body is connected with the second body, wherein, an angle value between the first body and the second body can vary by rotating around the connection device; a first torque generator and a second torque generator provided inside the connection body;

Wherein, when the angle value is in a first preset threshold range, the first torque generator generates a first torque for balancing a second torque generated by gravitation of the first body; when the angle value is larger than a maximum value of the first preset threshold range, the first torque generator generates a third torque, the second torque generator generates a fourth torque, the third torque and the fourth torque balancing a fifth torque generated by the first composite force, wherein, the first composite force is a composition of the gravitation of the first body and a push force acting on the touch control unit.

Also, the connection device further includes:

A crossbar, the first torque generator and the second torque generator are provided outside the crossbar.

Also, the first torque generator specifically includes:

A first elastic device which has a hollow structure and is sleeved outside the crossbar;

A first recess member which has a hollow structure and sleeved outside the crossbar, wherein, the first recess member includes a first recess region.

A first protrusion member which has a hollow structure and is adjacent to the first recess member and sleeved outside the crossbar, wherein, the first protrusion member includes a first protrusion region corresponding to the first recess region;

Wherein, when the angle value between the first body and the second body is less than a first preset angle value, the first protrusion region is within the first recess region; when the angle value between the first body and the second body is larger than the first preset angle value, the first protrusion region and the first recess member interact with each other so as to press the first elastic device to generate the first torque.

Also, the second torque generator specifically includes:

A second elastic device which has a hollow structure and is sleeved outside the crossbar;

A second recess member which has a hollow structure and is sleeved outside the crossbar, wherein, the second recess member includes a second recess region;

A second protrusion member which has a hollow structure and is adjacent to the second recess member and is sleeved outside the crossbar, wherein, the second protrusion member includes a second protrusion region corresponding to the second recess region;

Wherein, when the angle value between the second body and the second body is less than a second preset angle value, the second protrusion region is within the second recess region; when the angle value between the second body and the second body is larger than the second preset angle value, the second protrusion region and the second recess member interact with each other so as to press the second elastic device to generate the second torque, wherein, the first preset angle value is less than the second preset angle value.

Further, the first elastic device is spring or elastic rubber; the second elastic device is spring or elastic rubber.

On the other hand, another embodiment of this application provides the following technical solution:

A connection device, includes:

A connection body through which the first body is connected with the second body, wherein, an angle value between the first body and the second body can vary by rotating around the connection body;

A first torque generator and a second torque generator provided inside the connection body;

Wherein, when the angle value is in a first preset threshold range, the first torque generator generates a first torque for balancing a second torque generated by the gravitation of the first body; when the angle value is larger than a maximum value of the first preset threshold range, the first torque generator generates a third torque, the second torque generator generates a fourth torque, the third torque and the fourth torque balancing a fifth torque generated by a first composite force, wherein, the first composite force is a composition of the gravitation of the first body and a push force acting on touch control unit of the first body.

Also, the connection device further includes:

A crossbar, the first torque generator and the second torque generator are provided on the surface of the crossbar.

Also, the first torque generator specifically includes:

A first elastic device which has a hollow structure and is sleeved outside the crossbar;

A first recess member which has a hollow structure and is sleeved outside the crossbar, wherein, the first recess member includes a first recess region;

A first protrusion member which has a hollow structure and is adjacent to the first recess member and is sleeved outside the crossbar, wherein, the first protrusion member includes a first protrusion region corresponding to the first recess region;

Wherein, when the angle value between the first body and the second body is less than a first preset angle value, the first protrusion region is within the first recess region; when the angle value between the first body and the second body is larger than the first preset angle value, the first protrusion region and the first recess member interact with each other so as to press the first elastic device to generate the first torque.

Also, the second torque generator specifically includes:

A second elastic device which has a hollow structure and is sleeved outside the crossbar;

A second recess member which has a hollow structure and is sleeved outside the crossbar, wherein, the second recess member includes a second recess region;

A second protrusion member which has a hollow structure and is adjacent to the second recess member and is sleeved outside the crossbar, wherein, the second protrusion member includes a second protrusion region corresponding to the second recess region;

Wherein, when the angle value between the second body and the second body is less than a second preset angle value, the second protrusion region is within the second recess region; when the angle value between the second body and the second body is larger than the second preset angle value, the second protrusion region and the second recess member interact with each other so as to press the second elastic device to generate the second torque, wherein, the first preset angle value is less than the second preset angle value.

Further, the first elastic device is spring or elastic rubber; the second elastic device is spring or elastic rubber.

One or more technical solutions provided by the embodiment of this application at least have the following technical effects or advantages:

(1) Since in the embodiment of this application, the first torque generator in the electronic apparatus generates the third torque, the second torque generator generates the fourth torque, the third torque and the fourth torque can balance the fifth torque generated by a composite force of the gravitation of the first body and the push force on the touch control unit of the electronic apparatus, it ensures that the display screen does not shake when there is a touch control operation, to achieve the technical effect of ensuring accuracy of the touch control operation;

(2) Also since in the embodiment of this application, the second torque generator generates the fourth torque only when the angle value between the first body and the second body of the electronic apparatus is larger than the maximum value of the first preset threshold range, when the electronic apparatus is in a closed status, the second torque generator is not in working status, so as to achieve the technical effect of preventing torque rebound phenomenon to extend service life of the electronic apparatus.

DETAILED DESCRIPTION

The embodiment of the present application solves the technical problem that the positioning of the touch control operation to the electronic apparatus is not accurate or damage to the electronic apparatus in the prior art by providing an electronic apparatus and a connection device.

The technical solution of the embodiment of this application has an overall idea as follows for solving the above problem:

The electronic apparatus including the first body and the second body is provided with two torque generators, wherein, the first torque generator is for generating a first torque for supporting a second torque generated by the gravitation of the first body, thus, as long as the electronic apparatus is in open status, the first torque generator is in working status; and when the angle between the first body and the second body is larger than a preset threshold, the second torque generator generates a torque, thus, due to co-action of the first torque generator and the second torque generator, the technical problem that the touch control operation is inaccurate due to the shake of the display screen when there is touch control operation on the display screen is prevented; and also because the second torque generator is in working status only when the angle between the first body and the second body is larger than the preset threshold, the generation of torque rebound phenomenon which causes the damage of the electronic apparatus when the electronic apparatus is off is prevented.

For understanding the above-described technical solution better, the above-described technical solution is explained in detail in combination with the accompanying drawings of the specification and the specific implementation mode.

Figure 1:
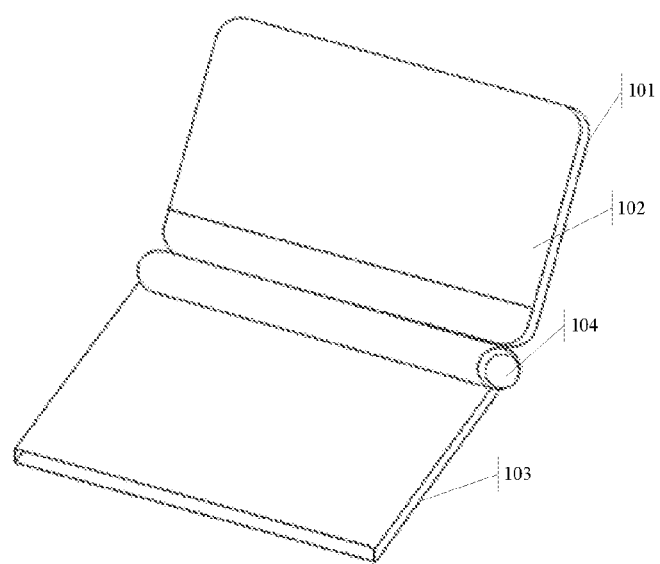
FIG. 1 is a structural diagram of the electronic apparatus in the prior art.
Figure 2:
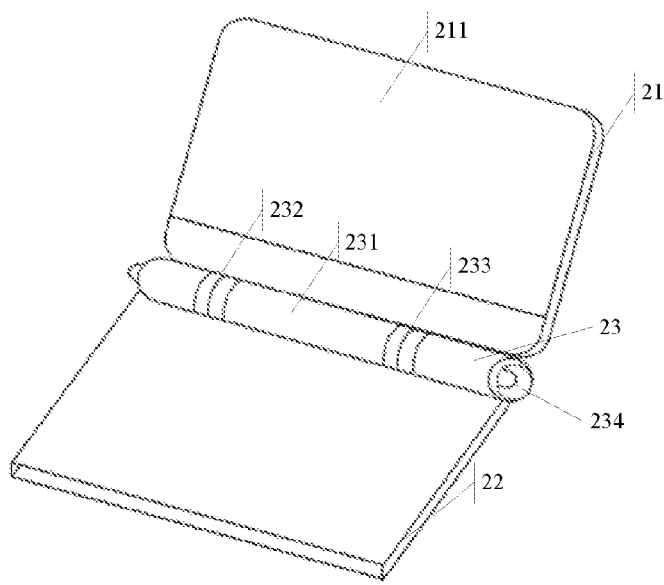
FIG. 2 is a structural diagram of the electronic apparatus in embodiment of this application.

In an embodiment of this application, an electronic apparatus, which can be laptop computer, flip phone or the like is provided. As shown in FIG. 2, the electronic apparatus includes the following structure:

A first body 21 including a touch control unit 211;

The first body 21 may be a display screen having touch control function of the electronic apparatus, then the display screen corresponds to the touch control unit 211, the user can carry out various kinds of touch control operations on the touch control screen; in another embodiment, the display screen of the electronic apparatus is a general display screen, and there includes a touch control panel on the display screen, thus the touch control panel corresponds to the touch control unit 211; in another embodiment, the first body is a general touch control panel which corresponds to the touch control unit 211. This application does not make any limitation on which component of the electronic apparatus the first body 21 corresponds to, which component of the electronic apparatus the touch control unit 211 corresponds to in the specific implementation procedure.

A second body 22;

In one embodiment, the second body 22 is a host of the electronic apparatus for controlling the interior running procedure of the electronic apparatus; in another embodiment, the second body 22 is a keyboard for conducting input operation; in another embodiment, the second body is a touch control panel for conducting touch control operation. This application does not make any limitation on which structure the second body 22 is in the specific implementation procedure.

A connection device 23; further referring to FIG. 2, the connection device 23 specifically includes:

A connection body 231 through which the first body 21 is connected with the second body 22, wherein, an angle value between the first body 21 and the second body 22 can vary by rotating around the connection device 23;

A first torque generator 232 and a second torque generator 233 provided inside the connection body 231;

wherein, when the angle value is in a first preset threshold range, the first torque generator 232 generates the first torque for balancing the second torque generated by the gravitation of the first body 21; when the angle value is larger than maximum value of the first preset threshold range, the first torque generator 232 generates a third torque, the second torque generator 233 generates a fourth torque, the third torque and the fourth torque balancing the fifth torque generated by a first composite force, wherein, the first composite force is composition of the gravitation of the first body 21 and push force acting on the touch control unit 211.

Figure 3:
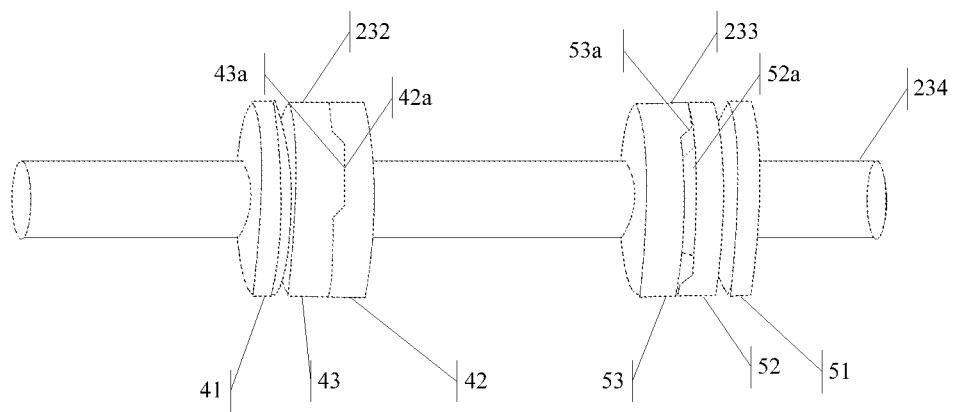
FIG. 3 is a schematic diagram of both the first torque generator and the second torque generator being in non-working state.
Figure 4:
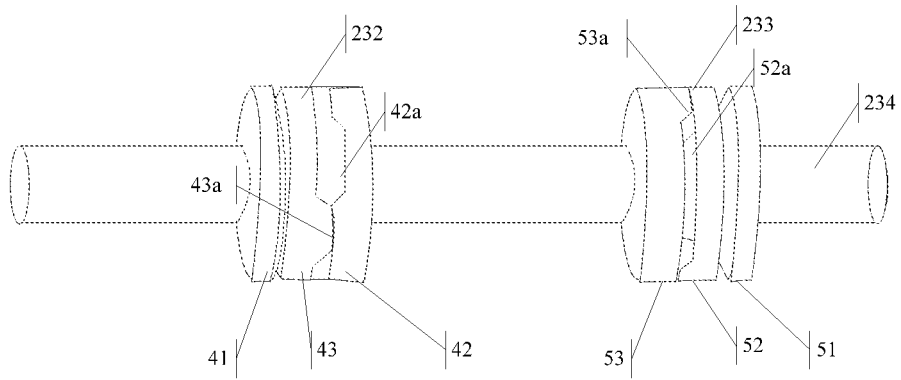
FIG. 4 is a schematic diagram of the first torque generator being in working status and the second torque generator being in non-working state.
Figure 5:
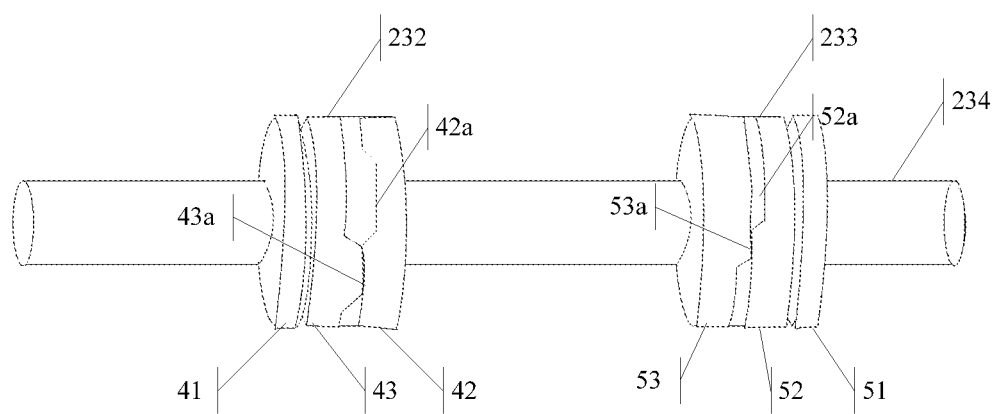
FIG. 5 is a schematic diagram of both the first torque generator and the second torque generator being in working status.

In the specific implementation procedure, with reference to FIG. 3, FIG. 4 and FIG. 5, wherein FIG. 3 is a schematic diagram of both of the first torque generator 232 and the second torque generator 233 being in non-working state; FIG. 4 is a schematic diagram of the first torque generator 232 being in working status and the second torque generator 233 being in non-working state; FIG. 5 is a schematic diagram of both of the first torque generator 232 and the second torque generator 233 being in working status. The connection device 21 further includes:

A crossbar 234; the first torque generator 232 and the second torque generator 233 are provided outside the crossbar 234.

When the connection device 23 includes the crossbar 234, the first torque generator 232 and the second torque generator 233 can be the following structures respectively:

The first torque generator 232 specifically includes:

A first elastic device 41 which has a hollow structure and is sleeved outside of the crossbar 234; in the specific implementation procedure, the first elastic device 41 is for example spring, elastic rubber, metallic shell fragment or the like. This application does not make any limitation on which material the first elastic device 41 is in the specific implementation procedure.

A first recess member 42 which has a hollow structure and is sleeved outside of the crossbar 234, wherein, the first recess member 42 includes a first recess region 42a;

A first protrusion member 43 which has a hollow structure and is adjacent to the first recess member 42 and is sleeved outside of the crossbar 234, wherein, the first protrusion member 43 includes a first protrusion region 43a corresponding to the first recess region 42a;

In the specific implementation procedure, the first recess member 42 and the first protrusion member 43 are generally made of rigid material for example solid rubber, solid metal or the like. This application does not make any limitation on which material the first recess member 42 and the first protrusion member 43 are made of. Also, the first recess member 42 can be provided in the middle of the first elastic member 41 and the first protrusion member 43, or the first protrusion member 43 is provided in the middle of the first elastic member 41 and the first recess member 42, this application does not make any limitation on the sequence of how to arrange these three members.

Wherein, as shown in FIG. 3, when the angle value between the first body 21 and the second body 22 is less than the first preset angle value, the first protrusion region 43a is in the first recess region 42a; when the angle value between the first body 21 and the second body 22 is larger than the first preset angle value, as shown in FIG. 4, the first protrusion region 43a and the first recess member 42a interact with each other, so as to press the first elastic device 41 to generate the first torque.

In general, when the angle between the first body 21 and the second body 22 of the electronic apparatus is 0 degree, since the first torque generator 232 does not need to generate the first torque for supporting the gravitation of the first body 21, in this case, the first torque generator 232 is in non-working status. And when the angle between the first body 21 and the second body 22 is larger than 0 degree, the first torque for supporting the gravitation of the first body 21 needs to be generated, thus, the first recess member 42 rotates with respect to the first protrusion member 43 to make the first protrusion region 43a separate from the first recess region 42a to generate an engagement force, the direction of the engagement force is opposite to the direction of the gravitation of the first body 21, so as to support the gravitation of the first body 21.

The second torque generator 22 specifically includes:

A second elastic device 51 which has a hollow structure and is sleeved outside of the crossbar 234; the second elastic device 51 is for example spring, elastic rubber, metallic shell fragment or the like. This application does not make any limitation on which material the second elastic device 51 is in the specific implementation procedure.

A second recess member 52 which has a hollow structure and is sleeved outside of the crossbar 234, wherein, the second recess member 52 includes a second recess region 52a;

A second protrusion member 53 which has a hollow structure and is adjacent to the second recess member 52 and is sleeved outside of the crossbar 234, wherein, the second protrusion member 53 includes a second protrusion region 53a corresponding to the second recess region 52a;

In the specific implementation procedure, the second recess member 52 and the second protrusion member 53 are generally made of rigid material for example solid rubber, solid metal or the like. This application does not make any limitation on which material the second recess member 52 and the second protrusion member 53 are made of. Further, the second recess member 52 can be provided in the middle of the second elastic member 51 and the second protrusion member 53, and the second protrusion member 53 can be provided in the middle of the second elastic member 51 and the second recess member 52, this application does not make any limitation on which sequence these three members are arranged.

Wherein, as shown in FIG. 3 and FIG. 4, when the angle value between the first body 21 and the second body 22 is less than the second preset angle value, the second protrusion region 53a is in the second recess region 52a; as shown in FIG. 5, when the angle value between the first body 21 and the second body 22 is larger than the second preset angle value, the second protrusion region 53a and the second recess member 52 interact with each other, so as to press the second elastic device 51 to generate the fourth torque, wherein, the first preset angle value is less than the second preset angle value.

In general cases, when the user uses the electronic apparatus, the angle value between the first body 21 and the second body 22 is generally larger than 90 degree, thus, the second preset angle value can be set to 90 degree, of course, it could be other value such as 80 degree, 100 degree or the like, this application does not make any limitation on which value the second preset angle value is. Wherein, when the angle between the first body 21 and the second body 22 is less than 90 degree, the second protrusion region 53b is provided in the second recess region 52b, with the rotation of the first body 21 with respect to the second body 22, the second protrusion member 53 also rotates with respect to the second recess member 52, and when the angle value is larger than 90 degree, the first protrusion region 53b rotates to the outside of the second recess region 52b so as to generate an engagement force. Since the engagement force can be generated between the first torque generator 232 and the second torque generator 233, the touch control force on the touch control unit 211 and the gravitation of the first body 21 can be balanced well.

What should be noted is that connection device 23 itself can be an independent invention.

Further referring to FIG. 3, FIG. 4 and FIG. 5, the connection device 23 specifically includes the following structure:

A connection body 231 through which the first body 21 is connected with the second body 22, wherein, the angle value between the first body 21 and the second body 22 can vary by rotating around the connection body 231;

A first torque generator 232 and a second torque generator 233 provided inside the connection body 231;

Wherein, when the angle value is in a first preset threshold range, the first torque generator 232 generates the first torque for balancing the second torque generated by the gravitation of the first body 21; when the angle value is larger than the maximum value of the first preset threshold range, the first torque generator 232 generates a third torque, the second torque generator 233 generates a fourth torque, the third torque and the fourth torque balancing a fifth torque generated by a first composite force, wherein, the first composite force is a composition of the gravitation of the first body 21 and a push force acting on the touch control unit 211 of the first body 21.

In the specific implementation procedure, the connection device 23 further includes:

A crossbar 234, the first torque generator 232 and the second torque generator 233 are provided on the surface of the crossbar 234.

When the connection device 23 includes the crossbar 234, the first torque generator 232 specifically includes:

A first elastic device 41 which has a hollow structure and is sleeved outside the crossbar 234; in the specific implementation procedure, the first elastic device 41 is spring, elastic rubber or other elastic material, and this application does not make any limitation.

A first recess member 42 which has a hollow structure and is sleeved outside the crossbar 234, wherein, the first recess member 42 includes a first recess region 42a;

A first protrusion member 43 which has a hollow structure and is adjacent to the first recess member 42 and is sleeved outside the crossbar 234, wherein, the first protrusion member 43 includes a first protrusion region 42b corresponding to the first recess region 42a;

Wherein, when the angle value between the first body 21 and the second body 22 is less than a first preset angle value, the first protrusion region 43a is in the first recess region 42a; when the angle value between the first body 21 and the second body 22 is larger than the first preset angle value, the first protrusion region 43a and the first recess member 42a interact with each other so as to press the first elastic device 42 to generate the first torque or the third torque.

The second torque generator 233 specifically includes:

A second elastic device 51 which has a hollow structure and is sleeved outside the crossbar 234; in the specific implementation procedure, the second elastic device 51 is spring, elastic rubber or other elastic material, and this application does not make any limitation.

A second recess member 52 which has a hollow structure and is sleeved outside the crossbar 234, wherein, the second recess member 52 includes a second recess region 52a;

A second protrusion member 53 which has a hollow structure and is adjacent to the second recess member 52 and is sleeved outside the crossbar 234, wherein, the second protrusion member 53 includes a second protrusion region 53a corresponding to the second recess region 52a;

Wherein, when the angle value between the first body 21 and the second body 22 is less than a second preset angle value, the second protrusion region 53a is within the second recess region 52a; when the angle value between the first body 21 and the second body 22 is larger than the second preset angle value, the second protrusion region 53 and the second recess member 52 interact with each other so as to press the second elastic device 51 to generate the fourth torque, wherein, the first preset angle value is less than the second preset angle value.

For those skilled in the art to understand the specific operation procedure of the electronic apparatus introduced in the embodiment of this application, in the following, how the electronic apparatus works are introduced in detail at the user side.

Wherein, it assumes that the first preset angle value is 0 degree and the second preset angle value is 90 degree, then the range of the first preset threshold is 0-90 degree, the electronic apparatus is a laptop computer, the first body 21 is the display screen of the laptop computer and the second body 22 is the host of the laptop computer.

At time of T1, the laptop computer is in closed status, at this time, there is no user using this laptop computer, that is, the angle between the display screen and the host is 0 degree, in this case, the first torque generator 232 and the second torque generator 233 are all in non-working status;

At time of T2 after T1, the user A opens the host and the display screen of the laptop computer to carry out some operation. Immediately after the angle between the mainframe and the display screen exceeds 0 degree, the first protrusion member 43a and the first recess member 42a in the first torque generator 232 begin to interact with each other to generate the first torque balancing the second torque generated by the gravitation of the display screen.

At time of T3 after T2, the angle between the host and the display screen is larger than 90 degree, in this case, the second protrusion member 53a and the second recess member 52a in the second torque generator 233 begin to interact with each other, so as to generate the fourth torque, and since the second torque generator 233 is in working status, the torque generated by the first torque generator 232 varies from the first torque to the third torque. Since there is no touch control operation on the display screen at this time, the third torque and the fourth torque only need to balance the torque generated by the gravitation of the display screen.

At time of T4 after T3, the angle between the host and the display screen has been appropriate for the user to carry out touch control operation, for example, the angle value is 110 degree, in this case, the user stop rotating the display screen and begins to carry out touch control operation on the surface of the display screen, in this case, there would be a composite force of the active force of the touch control operation and the gravitation of the display screen balancing the composite force between the third torque and the fourth torque.

At time of T5 after T4, the user stop using the laptop computer and close the host and the display screen, when the angle between the host and the display screen is larger than 90 degree, since there are two torque generators at the same time, rotation is relative difficult; and when the angle is less than 90 degree, only one torque generator works, so that the display screen and the host can be closed conveniently and the torque rebound phenomenon is small, which results in few damage to the electronic apparatus.

One or more technical solutions provided by the embodiment of this application at least have the following technical effects or advantages:

(1) Since in the embodiment of this application, the first torque generator in the electronic apparatus generates the third torque, the second torque generator generates the fourth torque, the third torque and the fourth torque can balance the fifth torque generated by a composite force of the gravitation of the first body and a push force on the touch control unit of the electronic apparatus, it ensures that the display screen does not shake when there is touch control operation, to achieve technical effect of ensuring accuracy of the touch control operation;

(2) Also since in the embodiment of this application, the second torque generator generates the fourth torque only when the angle value between the first body and the second body of the electronic apparatus is larger than the maximum value of the first preset threshold range, when the electronic apparatus is in a closed status, the second torque generator is not in working status, so as to achieve technical effect of preventing torque rebound phenomenon to extend service life of the electronic apparatus.

Though the preferred embodiments of the present invention are described, those skilled in the art can make additional alteration and modification to these embodiments in case of knowing the basic creative concept. Therefore, the appended claims intend to be defined as including the preferable embodiments as well as all of the alterations and modifications fallen into the scope of the present invention.

It is obvious that those skilled in the art can make various kinds of modifications and variations to the present invention without departing from the spirit and scope of the present invention. Thus, if these modifications and variations of the present invention fall within the scope of the claims of the present invention and the equivalent technology, the present invention intends to comprise these modifications and variations.

The invention claimed is:

1. An electronic apparatus, including:
   a first body, the first body including a touch control unit;
   a second body;
   a connection device including: a connection body through which the first body is connected with the second body, wherein, an angle value of the first body relative to the second body can vary by rotating around the connection device; a first torque generator including a first recess member and a first protrusion member interacted with each other to generate a torque and provided inside the connection body; and a second torque generator including a second recess member and a second protrusion member interacted with each other to generate a torque and provided inside the connection body;
   the first torque generator further includes a first elastic device that can be pressed under the interaction between the first recess member and the first protrusion member, the second torque generator further includes a second elastic device that can be pressed under the interaction between the second recess member and the second protrusion member;
   wherein, one of the first recess member and second recess member and the respective first protrusion member and second protrusion member is fixedly connected to one of the first body and the second body, and the other of the first recess member and second recess member and the respective first protrusion member and second protrusion member is fixedly connected to the other one of the first body and the second body such that rotation of one of the first body or the second body with respect to the other of the first body or the second body enables the recess member and the protrusion member to interact to generate torque; and
   wherein when the angle value is in a first preset threshold range, the first torque generator generates a first torque for balancing a second torque generated by a gravitational effect generated by a weight of the first body, and a torque generated by the second torque generator remains zero or constant; and
   when the angle value is larger than a maximum value of the first preset threshold range, the first torque generator generates a third torque, which is greater than the torque generated by it when the angle value is in the first preset threshold range, and the second torque generator generates a fourth torque, the third torque and the fourth torque balancing a fifth torque generated by a first composite force, wherein, the first composite force is a composition of the gravitational effect and a push force acting on the touch control unit.

2. The electronic apparatus according to claim 1, wherein, the connection device further includes a crossbar, the first torque generator and the second torque generator being provided on the surface of the crossbar.

3. The electronic apparatus according to claim 2, wherein, the first elastic device has a hollow structure and is sleeved outside the crossbar;
   the first recess member has a hollow structure and is sleeved outside the crossbar, the first recess member including a first recess region;
   the first protrusion member has a hollow structure and is adjacent to the first recess member and is sleeved outside the crossbar, the first protrusion member including a first protrusion region corresponding to the first recess region; and
   when the angle value of the first body relative to the second body is in the first preset threshold range, the first protrusion region is within the first recess region;
   when the angle value of the first body relative to the second body is larger than the maximum value of the first preset threshold range, the first protrusion region and the first recess member interact with each other so as to press the first elastic device to generate the first torque or the third torque.

4. The electronic apparatus according to claim 2, wherein, the second elastic device has a hollow structure and is sleeved outside the crossbar;

wherein the second recess member has a hollow structure and is sleeved outside the crossbar, the second recess member including a second recess region;

wherein the second protrusion member has a hollow structure and is adjacent to the second recess member and is sleeved outside the crossbar, the second protrusion member including a second protrusion region corresponding to the second recess region;

wherein, when the angle value of the first body relative to the second body is in a second preset threshold range, the second protrusion region is within the second recess region; when the angle value of the first body relative to the second body is larger than a maximum value of the second preset threshold range, the second protrusion region and the second recess member interact with each other so as to press the second elastic device to generate the fourth torque, wherein, the maximum value of the first preset threshold range is less than the maximum value of the second preset threshold range.

5. The electronic apparatus according to claim 4, wherein, the first elastic device is spring or elastic rubber; and the second elastic device is spring or elastic rubber.

6. A connection device, including:

a connection body through which a first body is connected with a second body, wherein, an angle value of the first body relative to the second body can vary by rotating around the connection body;

a first torque generator including a first recess member and a first protrusion member interacting with each other to generate a torque and being inside the connection body, and a second torque generator including a second recess member and a second protrusion member interacted with each other to generate a torque and provided inside the connection body;

the first torque generator further includes a first elastic device that can be pressed under the interaction between the first recess member and the first protrusion member, the second torque generator further includes a second elastic device that can be pressed under the interaction between the second recess member and the second protrusion member;

wherein, one of the first recess member and second recess member and the respective first protrusion member and second protrusion member is fixedly connected to one of the first body and the second body, and the other of the first recess member and second recess member and the respective first protrusion member and second protrusion member is fixedly connected to the other one of the first body and the second body such that rotation of one of the first body or the second body with respect to the other of the first body or the second body enables the recess member and the protrusion member to interact to generate torque; and wherein, when the angle value is in a first preset threshold range, the first torque generator generates a first torque for balancing a second torque generated by a gravitational effect generated by a weight of the first body, and a torque generated by the second torque generator remains zero or constant; and when the angle value is larger than a maximum value of the first preset threshold range, the first torque generator generates a third torque, the second torque generator generates a fourth torque, which is greater than the torque generated by it when the angle value is in the first preset threshold range, the third torque and the fourth torque balancing a fifth torque generated by a first composite force, wherein, the first composite force is a composition of the gravitational effect and a push force acting on the first body.

7. The electronic apparatus according to claim 6, wherein, the connection device further includes a crossbar, the first torque generator and the second torque generator being provided on the surface of the crossbar.

8. The connection device according to claim 7, wherein, the first elastic device has a hollow structure and is sleeved outside the crossbar;

wherein the first recess member has a hollow structure and is sleeved outside the crossbar, the first recess member including a first recess region;

wherein the first protrusion member has a hollow structure and is adjacent to the first recess member and is sleeved outside the crossbar, the first protrusion member including a first protrusion region corresponding to the first recess region;

wherein, when the angle value of the first body relative to the second body is in the first preset threshold range, the first protrusion region is within the first recess region; when the angle value of the first body relative to the second body is larger than the maximum value of the first preset threshold range, the first protrusion region and the first recess member interact with each other so as to press the first elastic device to generate the first torque or the third torque.

9. The connection device according to claim 8, wherein, the second elastic device has a hollow structure and is sleeved outside the crossbar;

wherein the second recess member has a hollow structure and is sleeved outside the crossbar, the second recess member including a second recess region;

wherein the second protrusion member has a hollow structure and is adjacent to the second recess member and is sleeved outside the crossbar, the second protrusion member including a second protrusion region corresponding to the second recess region;

wherein, when the angle value of the first body relative to the second body is in a second preset threshold range, the second protrusion region is within the second recess region; when the angle value of the first body relative to the second body is larger than the maximum value of the second preset threshold range, the second protrusion region and the second recess member interact with each other so as to press the second elastic device to generate the fourth torque, wherein, the maximum value of the first preset threshold range is less than the maximum value of the second preset threshold range.

10. The connection device according to claim 9, wherein, the first elastic device is spring or elastic rubber; and the second elastic device is spring or elastic rubber.

* * * * *